United States Patent
Cullen

(10) Patent No.: US 9,236,830 B2
(45) Date of Patent: Jan. 12, 2016

(54) ELECTRICAL MACHINE

(75) Inventor: John J A Cullen, Derby (GB)

(73) Assignee: ROLLS-ROYCE plc, London (GB)

(*) Notice: Subject to any disclaimer, the term of this patent is extended or adjusted under 35 U.S.C. 154(b) by 824 days.

(21) Appl. No.: 13/512,123

(22) PCT Filed: Nov. 18, 2010

(86) PCT No.: PCT/EP2010/067757
§ 371 (c)(1),
(2), (4) Date: May 25, 2012

(87) PCT Pub. No.: WO2011/069801
PCT Pub. Date: Jun. 16, 2011

(65) Prior Publication Data
US 2012/0249029 A1    Oct. 4, 2012

(30) Foreign Application Priority Data

Dec. 7, 2009 (GB) .................................... 0921323.2

(51) Int. Cl.
*H02H 7/08* (2006.01)
*H02P 29/02* (2006.01)
*G01R 31/34* (2006.01)

(52) U.S. Cl.
CPC ............ *H02P 29/022* (2013.01); *H02P 29/023* (2013.01); *G01R 31/34* (2013.01)

(58) Field of Classification Search
CPC ............ H02P 6/0001; H02P 6/12; H02P 6/14
USPC .................................................... 318/400.21
See application file for complete search history.

(56) References Cited

U.S. PATENT DOCUMENTS 6,504,281 B1 * 1/2003 Smith et al. .................... 310/190
7,253,634 B1 * 8/2007 Kasztenny et al. ........... 324/510
(Continued)

FOREIGN PATENT DOCUMENTS

DE   10 2007 049 313 A1   4/2009
EP   2 028 758 A1   2/2009
(Continued)

OTHER PUBLICATIONS

May 19, 2011 International Search Report issued in International Patent Application No. PCT/EP2010/067757.
(Continued)

*Primary Examiner* — Bentsu Ro
*Assistant Examiner* — Gabriel Agared
(74) *Attorney, Agent, or Firm* — Oliff PLC

(57) ABSTRACT

An electrical machine includes a stator including a plurality of electrical phases and a rotor having a plurality of magnets. Each electrical phase includes at least one coil and power electronics. There are means to detect an electrical short circuit in a faulted coil and means to supply an electrical current to the faulted coil when an electrical short circuit is detected in the faulted coil. The means to supply the electrical current to the faulted coil includes one or more un-faulted electrical phases of the electrical machine. The un-faulted electrical phases of the electrical machine are arranged to supply the electrical current to the electrical phase containing the faulted coil. The power electronics of the un-faulted electrical phases are arranged to supply the electrical current from the un-faulted electrical phase to the power electronics of the electrical phase having the faulted coil. This overcomes a problem of a fault in the DC or AC busbar of the electrical machine.

16 Claims, 2 Drawing Sheets

(56) References Cited

U.S. PATENT DOCUMENTS

| | | |
|---|---|---|
| 2003/0098626 A1 | 5/2003 | Ehrhart et al. |
| 2006/0087776 A1* | 4/2006 | Cullen et al. ............... 361/23 |
| 2006/0220607 A1* | 10/2006 | Imagawa et al. ........... 318/638 |
| 2007/0236186 A1* | 10/2007 | Patterson ..................... 322/59 |
| 2009/0045292 A1* | 2/2009 | Maddali et al. ............ 244/53 R |

FOREIGN PATENT DOCUMENTS

| | | |
|---|---|---|
| WO | WO 02/063760 A1 | 8/2002 |
| WO | WO 2005/011078 A1 | 2/2005 |

OTHER PUBLICATIONS

May 19, 2011 Written Opinion of the International Searching Authority issued in International Patent Application No. PCT/EP2010/067757.

Mar. 29, 2010 Search Report issued in British Patent Application No. GB0921323.2.

* cited by examiner

ELECTRICAL MACHINE

The present invention relates to electrical machines and in particular to fault tolerant electrical machines, particularly for use in gas turbine engines, on aircraft or on ships. The fault tolerant electrical machines may be electrical generators, electrical motors or electrical machines arranged to act as both electrical motors and electrical generators.

It is known from our published International patent application WO2005/011078A1 to inject current into a coil, or phase, of an electrical machine which has a short-circuited turn in the coil, or phase. The magnetic flux of the current injected into the coil, or phase, has to be of such a magnitude, frequency and phase that it opposes the magnetic flux from the permanent magnets of the rotor of the electrical machine.

In the prior art a suitable power supply, either a DC or AC busbar, is available to supply a current to the power electronics (PE) of the electrical machine and the power electronics supplies an electrical current to the coil, or phase, which has a short-circuit in a turn in the coil, or phase.

A problem with the prior art is that if there is a fault, e.g. an open-circuit, with the power supply, the DC or AC busbar, then it is not possible to supply an electrical current to the coil, or phase, which has a short-circuit in the turn in the coil, or phase.

Accordingly the present invention seeks to provide a novel electrical machine, which reduces, preferably overcomes, the above mentioned problem.

Accordingly the present invention provides an electrical machine comprising a stator including a plurality of electrical phases and a rotor having a plurality of magnets, each electrical phase comprising at least one coil and power electronics, means to detect an electrical short circuit in at least one of the coils to determine a faulted turn of the at least one coil, and means to supply an electrical current to the at least one of the coils having a faulted turn when an electrical short circuit is detected in the at least one of the coils, the means to supply the electrical current to the at least one of the coils having a faulted turn comprises at least one un-faulted electrical phase of the electrical machine.

Preferably the at least one un-faulted electrical phase of the electrical machine is arranged to supply the electrical current to the electrical phase containing the at least one of the coils having a faulted turn.

Preferably the power electronics of the at least one un-faulted electrical phase is arranged to supply the electrical current from the at least one un-faulted electrical phase to the power electronics of the electrical phase having the at least one of the coils having a faulted turn.

Preferably two or more of the un-faulted electrical phases of the electrical machine are arranged to supply the electrical current to the electrical phase containing the at least one of the coils having a faulted turn.

Possibly all of the un-faulted electrical phases of the electrical machine are arranged to supply the electrical current to the electrical phase containing the at least one of the coils having a faulted turn.

The power electronics of the at least one un-faulted phase of the electrical machine is arranged to store the electrical current in the power electronics before the power electronics of the at least one un-faulted electrical phase is arranged to supply the electrical current from the at least one un-faulted electrical phase to the power electronics of the electrical phase having the at least one of the coils having a faulted turn.

Preferably the magnets are permanent magnets.

Preferably the electrical machine is an electrical motor, an electrical generator or a combined electrical motor and electrical generator.

Preferably the electrical machine is an electrical starter/electrical generator.

Preferably the electrical machine is a fault tolerant electrical machine.

Preferably the electrical machine is an electrical machine of a gas turbine engine, an aircraft or a ship.

The electrical machine is connected to a busbar. The means to supply the electrical current to the at least one of the coils having a faulted turn comprises means to detect a short circuit or fault in the busbar and the means to detect a short circuit or fault in the busbar is arranged to allow the at least one un-faulted phase of the electrical machine to supply the electrical current to the at least one of the coils having a faulted turn if there is a short circuit or fault in the busbar.

The electrical machine may be connected to a busbar via a circuit breaker. The means to supply the electrical current to the at least one of the coils having a faulted turn comprises means to detect a disturbance in the voltage of the busbar and the means to detect a disturbance in the voltage in the busbar is arranged to open the circuit breaker if there is a disturbance in the voltage in the busbar to allow the at least one un-faulted phase of the electrical machine to supply the electrical current to the at least one of the coils having a faulted turn.

The present invention also provides a method of operating an electrical machine, the electrical machine comprising a stator including a plurality of electrical phases and a rotor having a plurality of magnets, each electrical phase comprising at least one coil and power electronics, the method comprising detecting an electrical short circuit in at least one of the coils to determine a faulted turn of the at least one coil, supplying an electrical current to the at least one of the coils having a faulted turn when an electrical short circuit is detected in the at least one of the coils and supplying the electrical current to the at least one of the coils having a faulted turn from at least one un-faulted electrical phase of the electrical machine.

The present invention will be more fully described by way of example with reference to the accompanying drawings, in which:—

Figure 1:
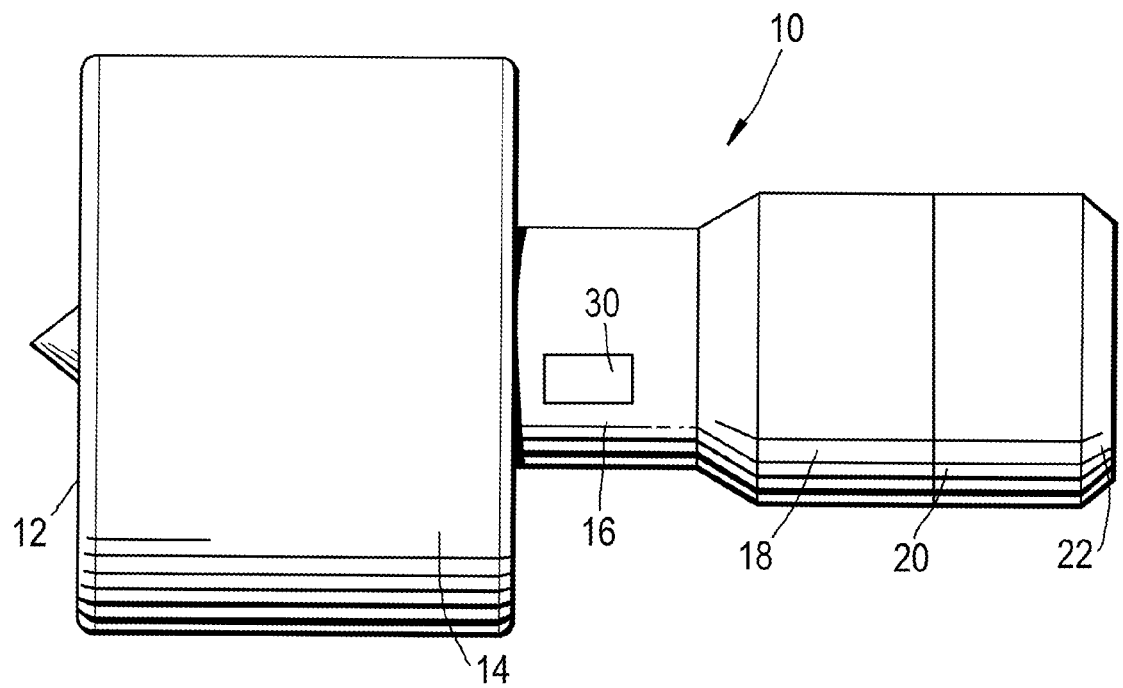
FIG. 1 shows a turbofan gas turbine engine having an electrical machine according to the present invention.

A turbofan gas turbine engine 10, as shown in FIG. 1, comprises in flow series an intake 12, a fan section 14, a compressor section 16, a combustion section 18, a turbine section 20 and an exhaust 22. The fan section 14 comprises a fan (not shown). The compressor section 16 comprises in flow series an intermediate-pressure compressor (not shown) and a high-pressure compressor (not shown). The turbine section 20 comprises in flow series a high-pressure turbine (not shown), an intermediate-pressure turbine (not shown) and a low-pressure turbine (not shown). The low-pressure turbine is arranged to drive the fan via a first shaft (not shown), the intermediate-pressure turbine is arranged to drive the intermediate-pressure compressor via a second shaft (not shown) and the high-pressure turbine is arranged to drive the high-pressure compressor via a third shaft (not shown). The turbofan gas turbine engine 10 also comprises an electrical machine 30 which is driven by the first shaft, the second shaft or the third shaft either directly or via a gearbox, a drive shaft and an accessory gearbox.

Figure 2:
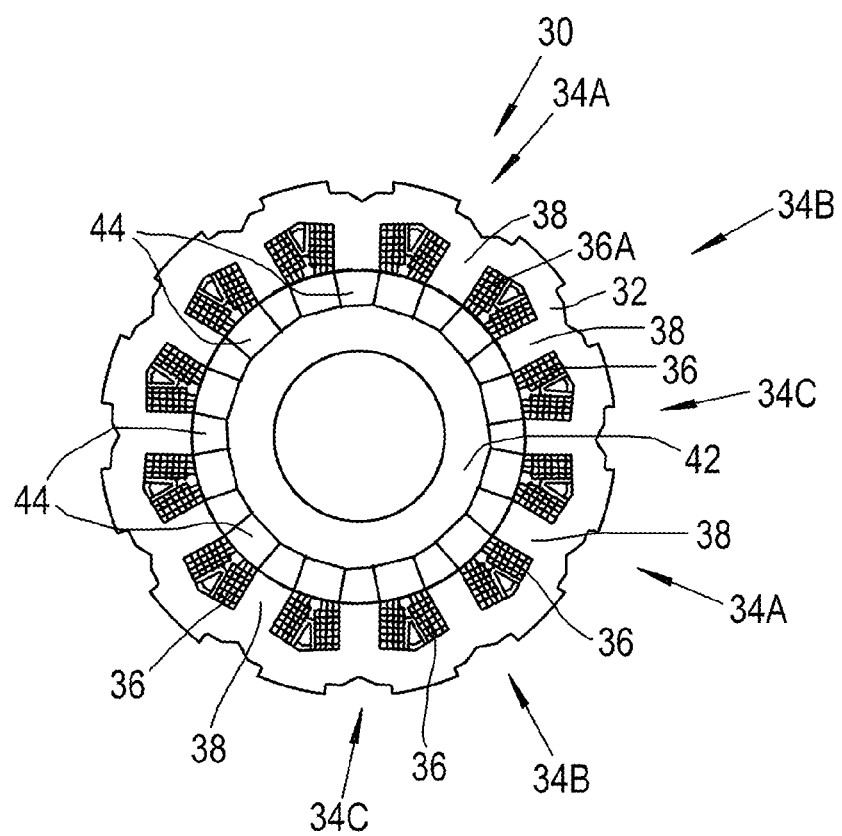
FIG. 2 is a cross-sectional view through an electrical machine according to the present invention.
Figure 3:
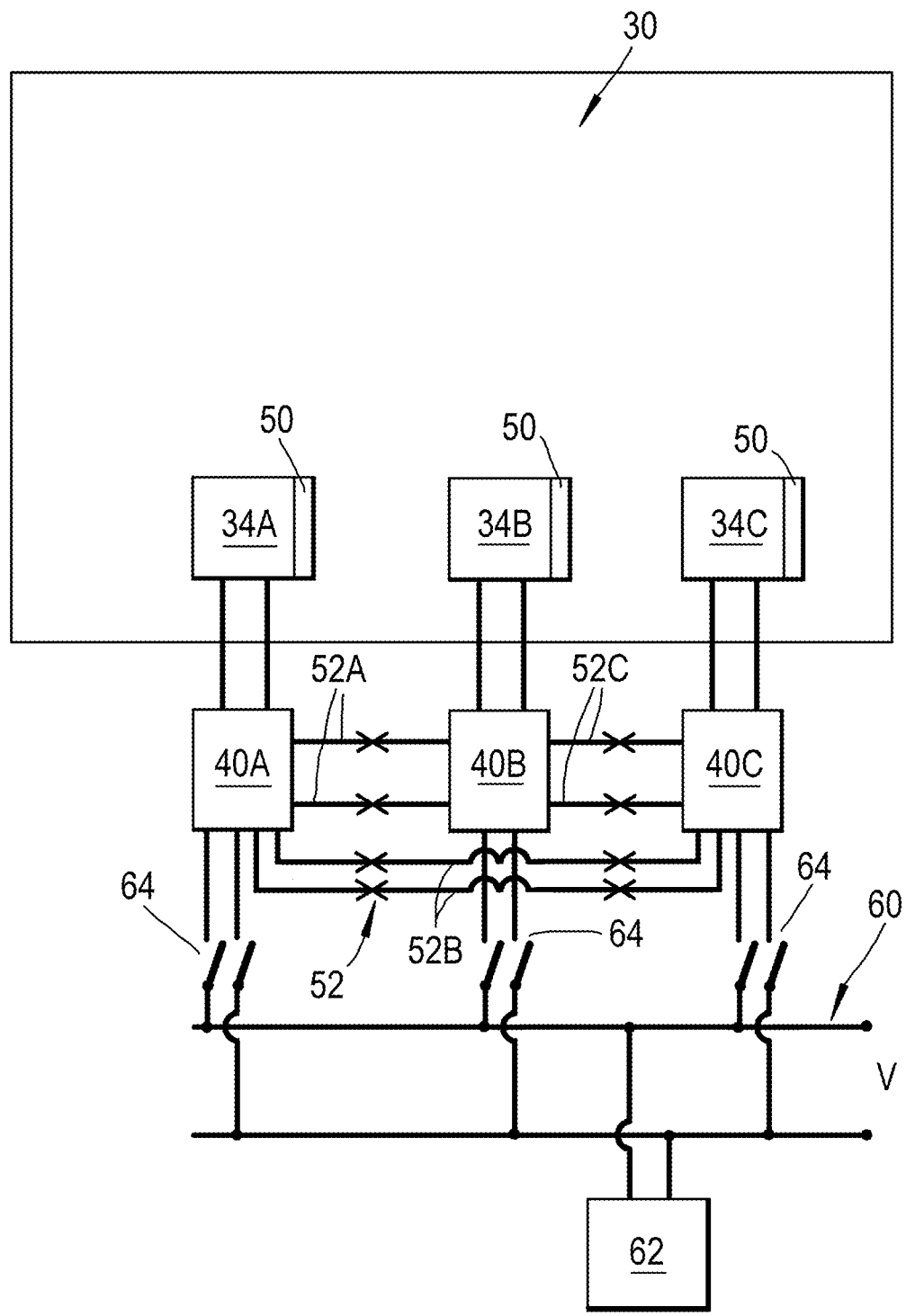
FIG. 3 is a schematic diagram of an electrical machine according to the present invention.

The electrical machine 30 as shown in FIGS. 2 and 3 comprises a stator 32 and a rotor 42. The stator 32 has a plurality of electrical phases, in this example three electrical phases 34A, 34B and 34C but the stator 32 may have any suitable number of electrical phases, and each electrical phase 34A, 34B, 34C comprises at least one electrical coil 36. The stator 32 has a plurality of circumferentially spaced radially inwardly extending teeth 38 and each electrical coil 36 is arranged around one of the teeth 38 of the stator 32. The electrical coils 36 in each of the electrical phases 34A, 34B, and 34C are circumferentially spaced around the stator 32 and the electrical coils 36 of different electrical phases 34A, 34B, and 34C are arranged circumferentially sequentially around the stator 32. Each of the electrical phases 34A, 34B, 34C is provided with respective power electronics 40A, 40B, 40C to control the respective electrical phase 34A, 34B, 34C of the electrical machine 30. The rotor 42 comprises a plurality of circumferentially spaced permanent magnets 44.

The electrical machine 30 also has means 50 to detect an electrical short circuit in one of the coils 36 to determine a faulted turn of the coil 36. The electrical machine 30 also has means 52 to supply an electrical current to the coil 36, with a faulted turn or a short circuit, when the electrical short circuit is detected in the coil 36 and the means 52 to supply the electrical current to the coil 36, with a faulted turn or a short circuit, comprises at least one un-faulted electrical phase 34A, 34B, 34C of the electrical machine 30. For example, if there is a short circuit due to a faulted turn in a coil 36A in the electrical phase 34A, this is detected and the un-faulted electrical phase 34B, the un-faulted electrical phase 34C or two or more or all of the un-faulted electrical phases 34B and 34C are arranged to supply an electrical current to the coil 36A with a faulted turn in the electrical phase 34A. The coil 36A with a faulted turn is known as a faulted coil and the electrical phase 34A with a faulted coil is known as a faulted electrical phase. It is to be noted that a faulted coil will generally mean a coil having one or more short circuited turns and also a plurality of un-short circuited turns such that an electrical current can be into the un-short circuited turns of the faulted coil.

The un-faulted electrical phase/phases 34B, 34C of the electrical machine 30 is/are arranged to supply the electrical current to the faulted electrical phase 34A containing a faulted coil 36A, a coil 36A with a faulted turn or a short circuit, to prevent excessive current flow in the faulted electrical phase 34A containing the faulted coil 36A, coil 36A with a faulted turn or a short circuit, to prevent over heating of the faulted coil 36A and the associated faulted electrical phase 34A. The magnetic flux of the current injected into the faulted coil 36A, or faulted electrical phase 34A, has to be of such a magnitude, frequency and phase that it opposes the magnetic flux from the permanent magnets 44 of the rotor 42 of the electrical machine 30.

In particular the electrical machine 30 is so arranged that the power electronics 40B or 40C of an un-faulted electrical phase 34B or 34C is arranged to supply the electrical current from the un-faulted electrical phase 34B or 34C to the power electronics 40A of the faulted electrical phase 34A having the faulted coil 36A, the coil 36A with a faulted turn or a short circuit via electrical connections 52A or 52B. It may also be possible to arrange the electrical machine 30 such that two, more than two or all of the un-faulted electrical phases 34B and 34C of the electrical machine 30 are arranged to supply the electrical current to the faulted electrical phase 34A containing the faulted coil 36A, the coil 36A with a faulted turn or a short circuit. The power electronics 40B and 40C of un-faulted electrical phase 34B and 34C are arranged to supply the electrical current from the un-faulted electrical phase 34B and 34C to the power electronics 40A of the faulted electrical phase 34A having the faulted coil 36A, the coil 36A with a faulted turn or a short circuit via the electrical connections 52A and 52B. A further electrical connection 52C is provided between the power electronics 40B and 40C to enable supply the supply of electrical current there between should one of these electrical phases 40B or 40C have a coil which suffers from a short circuit in a turn.

The power electronics 40B, 40C of the at least one un-faulted phase 34B, 34C of the electrical machine 30 may be arranged to store the electrical current in the power electronics 40B, 40C before the power electronics 40B, 40C of the un-faulted electrical phase 34B, 34C is arranged to supply the electrical current from the un-faulted electrical phase 34B, 34C to the power electronics 40A of the faulted electrical phase 34A having the faulted coil 36A, the coil 36A with a faulted turn or a short circuit. Alternatively the power electronics 40B, 40C of the at least one un-faulted phase 34B, 34C of the electrical machine 30 may be arranged to supply the electrical current immediately from the un-faulted electrical phase 34B, 34C to the power electronics 40A of the faulted electrical phase 34A having the faulted coil 36A, the coil 36A with a faulted turn or a short circuit. Thus, the faulted electrical phase 34A with the faulted coil 36A, coil 36A with a faulted turn or short circuit is protected from further damage by heating due to over currents in the faulted electrical phase 34A.

The electrical machine 30 is electrically connected to a DC or AC busbar 60 and the means 52 to supply the electrical current to the faulted coil 36, with the faulted turn or short circuit, comprises means 62 to detect a short circuit of the busbar 60 and the means 62 to detect a short circuit of the busbar 60 is arranged to allow the at least one un-faulted phase 34B, 34C of the electrical machine 30 to supply the electrical current to the faulted coil 36A, the coil 36A with a faulted turn or a short circuit, if there is a short circuit or other fault in the busbar 60.

The means 50 to detect an electrical short circuit in one of the coils 36 to determine a faulted turn of the coil 36 may comprise a temperature sensor or temperature sensors to measure the temperature of the coil 36, a voltmeter to measure the voltage of the coil 36 or any other suitable device to detect a faulted turn in the coil 36.

The means 62 to detect a short circuit of the busbar 60 may comprise a voltmeter, an ammeter or a combination of a voltmeter and ammeter to monitor the voltage and current in the busbar 60.

Although the present invention has been described with reference to the use of a rotor with permanent magnets, it may be possible to use other types of magnets, e.g. electromagnets.

The electrical machine 30 is an electrical motor, an electrical generator or a combined electrical motor and electrical generator. It is preferred that the electrical machine 30 is an electrical starter/electrical generator such that the electrical machine 30 is used to start the turbofan gas turbine engine 10 and once the turbofan gas turbine engine 10 is operational the electrical machine 30 is used to generate electricity.

Preferably the electrical machine 30 is a fault tolerant electrical machine 30, such that it is particularly suitable for use on/in a gas turbine engine, an aircraft or a ship.

The advantage of the present invention is that if there is a fault, e.g. an open circuit fault, in the DC or AC busbar supplying electric current to the electrical machine and it is not possible to supply an electrical current from the DC or AC busbar into a faulted electrical phase with a faulted coil which has a faulted turn or short circuit then one or more of the un-faulted phases of the electrical machine are able to supply an electrical current to the faulted electrical phase with the faulted coil which has a faulted turn or short circuit. Furthermore, the present invention may also be used if there is a disturbance in the DC or AC busbar 60, which takes the system voltage outside its normal operating range. In these circumstances it may be possible to use a circuit breaker 64 to electrically disconnect the DC or AC busbar 60 from the power electronics 40A, 40B and 40C of the electrical machine 30 in order to supply the electrical current from the un-faulted electrical phases of the electrical machine 30. Thus, the means 52 to supply the electrical current to the at least one of the faulted coils comprises means 62 to detect a disturbance in the voltage of the busbar and the means to detect a disturbance in the voltage in the busbar is arranged to open the circuit breaker 64 if there is a disturbance in the voltage in the busbar 60 to allow the at least one un-faulted phase of the electrical machine 30 to supply the electrical current to the at least one of the faulted coils.

The means 62 to detect a disturbance in the voltage of the busbar 60 is also the means 62 to detect a short circuit of the busbar 60.

The invention claimed is:

1. An electrical machine comprising:
   a stator including a plurality of three or more electrical phases;
   a rotor having a plurality of magnets, each electrical phase comprising at least one coil and power electronics;
   a power supply for supplying power to each of the power electronics;
   electrical connections connecting each phase to at least two other phases while bypassing the power supply;
   means to detect an electrical short circuit in at least one of the coils to determine a faulted turn of the at least one coil, and
   means to supply an electrical current to the at least one of the coils having a faulted turn when an electrical short circuit is detected in the at least one of the coils, wherein:
      the means to supply the electrical current to the at least one of the coils having a faulted turn comprises electrical connections between at least one un-faulted electrical phase of the electrical machine and the phase containing the at least one of the coils having a faulted turn, and
      the at least one un-faulted electrical phase of the electrical maching is arranged to supply the electrical current to the electrical phase containing the at least one of the coils having a faulted turn.

2. An electrical machine as claimed in claim 1 wherein the power electronics of the at least one un-faulted electrical phase is arranged to supply the electrical current from the at least one un-faulted electrical phase to the power electronics of the electrical phase having the at least one of the coils having a faulted turn.

3. An electrical machine as claimed in claim 1 wherein two or more of the un-faulted electrical phases of the electrical machine are arranged to supply the electrical current to the electrical phase containing the at least one of the coils having a faulted turn.

4. An electrical machine as claimed in claim 3 wherein all of the un-faulted electrical phases of the electrical machine are arranged to supply the electrical current to the electrical phase containing the at least one of the coils having a faulted turn.

5. An electrical machine as claimed in claim 2 wherein the power electronics of the at least one un-faulted phase of the electrical machine is arranged to store the electrical current in the power electronics before the power electronics of the at least one un-faulted electrical phase is arranged to supply the electrical current from the at least one un-faulted electrical phase to the power electronics of the phase having the at least one of the coils having a faulted turn.

6. An electrical machine as claimed in claim 1 wherein the magnets are permanent magnets.

7. An electrical machine as claimed in claim 1 wherein the electrical machine is an electrical motor, an electrical generator or a combined electrical motor and electrical generator.

8. An electrical machine as claimed in claim 7 wherein the electrical machine is an electrical starter/electrical generator.

9. An electrical machine as claimed in claim 1 wherein the electrical machine is a fault tolerant electrical machine.

10. An electrical machine as claimed in claim 1 wherein the electrical machine is an electrical machine of a gas turbine engine, an aircraft or a ship.

11. An electrical machine as claimed in claim 1 wherein the electrical machine is connected to a busbar.

12. An electrical machine as claimed in claim 11 wherein the means to supply the electrical current to the at least one of the coils having a faulted turn comprises means to detect a short circuit or fault in the busbar and the means to detect a short circuit or fault in the busbar is arranged to allow the at least one un-faulted phase of the electrical machine to supply the electrical current to the at least one of the coils having a faulted turn if there is a short circuit or fault in the busbar.

13. An electrical machine as claimed in claim 12 wherein the electrical machine is connected to the busbar via a circuit breaker.

14. An electrical machine as claimed in claim 13 wherein the means to supply the electrical current to the at least one of the coils having a faulted turn comprises means to detect a disturbance in the voltage of the busbar and the means to detect a disturbance in the voltage in the busbar is arranged to open the circuit breaker if there is a disturbance in the voltage in the busbar to allow the at least one un-faulted phase of the electrical machine to supply the electrical current to the at least one of the coils having a faulted turn.

15. An electrical machine comprising:
   a stator including a plurality three or more electrical phases;
   a rotor having a plurality of magnets, the magnets are permanent magnets, each electrical phase comprising at least one coil and power electronics;
   a power supply for supplying power to each of the power electronics;
   electrical connections connecting each phase to at least two other phases while bypassing the power supply;
   a detector to detect an electrical short circuit in at least one of the coils to determine a faulted turn of the at least one coil; and
   an electrical supply to supply an electrical current to the at least one of the coils having a faulted turn when an electrical short circuit is detected in the at least one of the coils, wherein:
      the electrical supply to supply the electrical current to the at least one of the coils having a faulted turn comprises electrical connections between at least one un-faulted electrical phase of the electrical machine and the phase containing the at least one of the coils having a faulted turn, and
      the at least one un-faulted electrical phase of the electrical machine is arranged to supply the electrical current to the electrical phase containing the at least one of the coils having a faulted turn.

16. An electrical machine comprising:
a stator including a plurality of electrical phases and a rotor having a plurality of magnets, each electrical phase comprising:
at least one coil and power electronics,
means to detect an electrical short circuit in at least one of the coils to determine a faulted turn of the at least one coil, and
means to supply an electrical current to the at least one of the coils having a faulted turn when an electrical short circuit is detected in the at least one of the coils,
the electrical machine is connected to a busbar wherein the means to supply the electrical current to the at least one of the coils having a faulted turn comprises at least one un-faulted electrical phase of the electrical machine, the power electronics of the at least one un-faulted electrical phase is arranged to supply the electrical current from the at least one un-faulted electrical phase to the power electronics of the electrical phase having the at least one of the coils having a faulted turn via electrical connections,
the means to supply the electrical current to the at least one of the coils having a faulted turn comprises means to detect a short circuit or fault in the busbar and the means to detect a short circuit or fault in the busbar is arranged to allow the at least one un-faulted phase of the electrical machine to supply the electrical current to the at least one of the coils having a faulted turn if there is a short circuit or fault in the busbar.

* * * * *